(12) United States Patent
Manthena et al.

(10) Patent No.: US 12,538,491 B2
(45) Date of Patent: Jan. 27, 2026

(54) LATERAL ETCH STOPS FOR ACCESS LINE FORMATION IN A MEMORY DIE

(71) Applicant: Micron Technology, Inc., Boise, ID (US)

(72) Inventors: Raja Kumar Varma Manthena, Boise, ID (US); Yoshiaki Fukuzumi, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 673 days.

(21) Appl. No.: 17/876,326

(22) Filed: Jul. 28, 2022

(65) Prior Publication Data

US 2024/0040787 A1   Feb. 1, 2024

(51) Int. Cl.
*H10B 43/35* (2023.01)
*G11C 16/06* (2006.01)
*H10B 41/41* (2023.01)
*H10B 41/42* (2023.01)

(52) U.S. Cl.
CPC ............. *H10B 43/35* (2023.02); *G11C 16/06* (2013.01); *H10B 41/41* (2023.02); *H10B 41/42* (2023.02)

(58) Field of Classification Search
CPC . H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40-44; H10B 41/46-50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

2015/0179660 A1\* 6/2015 Yada .................... H10D 64/035
                                                    257/314
2016/0351497 A1\* 12/2016 Peri ..................... H01L 23/5226

\* cited by examiner

*Primary Examiner* — William B Partridge
*Assistant Examiner* — Gustavo G Ramallo
(74) *Attorney, Agent, or Firm* — Holland & Hart LLP

(57) ABSTRACT

Methods, systems, and devices for lateral etch stops for access line formation in a memory die are described. A memory die may be formed with isolation regions that provide an etch stop to limit the extent of voids formed by removing a sacrificial material between layers of a dielectric region. For example, first trenches may be formed through a stack of alternating layers of a dielectric material and a sacrificial material, in which one or more materials may formed. Second trenches may be formed between a first trench and an array portion of the memory die, or between pairs of the first trenches, which may support the removal of at least a portion of the sacrificial material to form voids for access line formation. However, the materials formed in the first trenches may provide a boundary, or a restriction zone, that limits an extent of the material removal operation.

17 Claims, 10 Drawing Sheets

SECTION A-A

SECTION A-A

LATERAL ETCH STOPS FOR ACCESS LINE FORMATION IN A MEMORY DIE

FIELD OF TECHNOLOGY

The following relates to one or more systems for memory, including lateral etch stops for access line formation in a memory die.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not- or (NOR) and not- and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
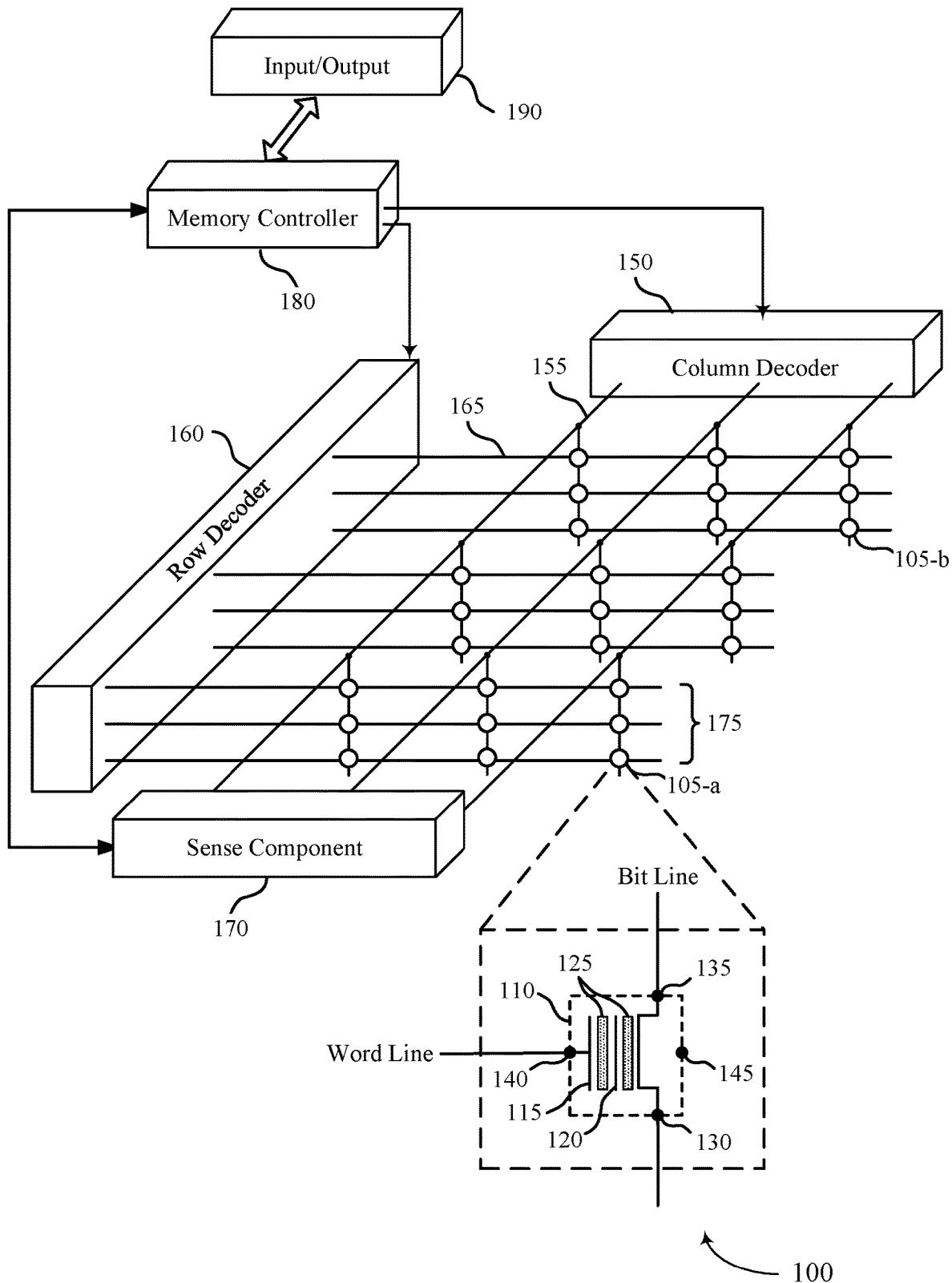
FIG. 1 illustrates an example of a system that supports lateral etch stops for access line formation in a memory die in accordance with examples as disclosed herein.

Memory dies of some memory architectures may include conductor portions that are respectively formed between dielectric portions (e.g., electrical insulators). For example, some memory architectures may include structures, such as pillars, that are formed through one or more layers of a dielectric material (e.g., layers deposited or otherwise formed over a substrate), and may also include one or more conductive access lines, between the one or more layers of the dielectric material, that are electrically coupled with the pillars. In a NAND implementation, for example, such pillars may include a semiconductor channel associated with one or more memory cells (e.g., along a height of each pillar), and such access lines may be associated with activating at least a portion of the semiconductor channel to access one or more of the memory cells.

In some examples of manufacturing such memory dies, forming conductive portions (e.g., access lines) between dielectric portions may involve: forming alternating layers, such as alternating layers of a dielectric material and a sacrificial material (e.g., between the layers of the dielectric material); forming voids by removing at least a portion of the sacrificial material; and forming (e.g., depositing) one or more conductive materials in the formed voids. In some examples, one or more of such forming operations may be performed after forming pillars through the dielectric material and the sacrificial material, such that the voids may expose sidewalls of the pillars (e.g., between layers of the dielectric material), or such that the one or more conductive materials may be otherwise coupled with (e.g., in contact with, electrically coupled with) the pillars. However, in some examples, one or more boundaries of the removal of the sacrificial material (e.g., a material removal extents, between the layers of the dielectric material) may be variable (e.g., within processing tolerances) or indeterminate. To avoid the conductor materials interfering with portions of a memory die that are intended to be electrically isolated from each other (e.g., a region including electrical contacts extending through the layers of the dielectric material), a memory die may include one or more non-functional regions (e.g., an inactive region, a region of dummy pillars that are not part of an active region of a memory array) within which a variable extent of voids and conductor formation (e.g., deposition) may not adversely affect operation of the memory die. However, such non-functional regions may occupy a portion of the memory die that is therefore unavailable for other structures that support the operation of the memory die.

In accordance with examples as disclosed herein, a memory die may be formed with one or more isolation regions that provide an etch stop (e.g., a lateral etch stop) to limit the extent of voids formed by removing a sacrificial material between layers of a dielectric region. For example, one or more first trenches may be formed through a stack of alternating layers of a dielectric material and a sacrificial material, in which one or more materials may formed (e.g., deposited). In some examples, one or more second trenches may be formed between the first trench and an array portion of the memory die, or between pairs of the first trenches, which may support the removal of at least a portion of the sacrificial material (e.g., in a wet etch or exhume operation) to form voids for access line formation. However, the one or more materials formed in the first trenches may provide a boundary (e.g., a restriction zone), that limits an extent of the material removal operation. Accordingly, one or more conductor materials deposited to form the access lines may be excluded from at least some regions of the memory die, which may support a more compact configuration of features that improves the utilization of an area of the memory die. In some examples, the formation of the one or more materials in the first trenches may be performed concurrently with other formation operations, such as operations for forming electrical contacts through the stack of alternating layers that also leverage the one or more materials (e.g., as a formation, such as a deposition or an oxidation, of a dielectric material followed by a formation, such as a deposition, of a conductive material). Thus, in some examples, isolation regions that support such etch stops may be formed with a minor increase in or no increase in a quantity of operations to form the memory die.

Figure 2:
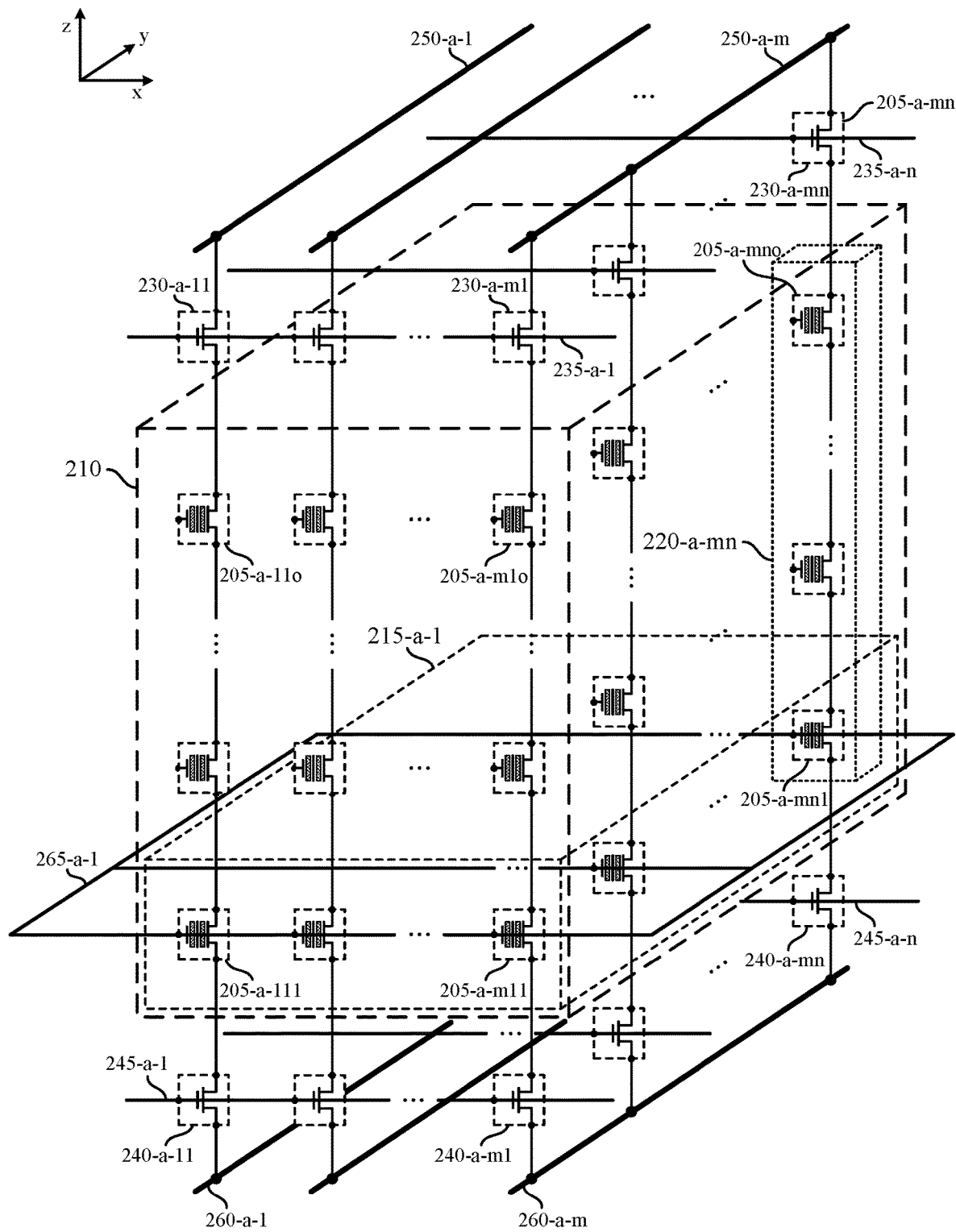
FIG. 2 illustrates an example of a memory architecture that supports lateral etch stops for access line formation in a memory die in accordance with examples as disclosed herein.

Features of the disclosure are initially described in the context of systems, devices, and circuits with reference to FIGS. 1 and 2. Features of the disclosure are described in the context of fabrication operations and layouts with reference to FIGS. 3 through 8. These and other features of the disclosure are further illustrated by and described in the context of flowcharts that relate to lateral etch stops for access line formation in a memory die with reference to FIGS. 9 and 10.

FIG. 1 illustrates an example of a memory device 100 that supports lateral etch stops for access line formation in a memory die in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-*a* that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-*a* is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. After accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some examples of manufacturing the memory device 100, forming access lines (e.g., word lines 165, bit lines 155, select lines 235, select lines 245) may involve: forming alternating layers, such as alternating layers of a dielectric material and a sacrificial material (e.g., between the layers of the dielectric material); forming voids by removing at least a portion of the sacrificial material; and forming one or more conductive materials in the formed voids. However, in some examples, one or more boundaries of the removal of the sacrificial material (e.g., a material removal extents, between the layers of the dielectric material) may be variable (e.g., within processing tolerances) or indeterminate. To avoid the formed conductor materials interfering with features that are intended to be electrically isolated from each other (e.g., a region including electrical contacts extending through the layers of the dielectric material), an associated memory die may be formed with one or more non-functional regions (e.g., an inactive region, a region of dummy pillars that are not part of an active region of a memory array) within which a variable extent of voids and conductor formation may not adversely affect operation of the memory device 100. However, such a non-functional regions may occupy a portion of the memory device 100 that is therefore unavailable for other structures that support the operation of the memory device 100.

In accordance with examples as disclosed herein, a memory die associated with the memory device 100 may be formed with one or more isolation regions that provide an etch stop (e.g., a lateral etch stop) to limit the extent of voids formed by removing a sacrificial material between layers of a dielectric region. For example, one or more first trenches may be formed through a stack of alternating layers of a dielectric material and a sacrificial material, in which one or more materials may formed (e.g., deposited). In some examples, one or more second trenches may be formed between the first trench and an array portion of the memory die, or between pairs of the first trenches, which may support the removal of at least a portion of the sacrificial material (e.g., in a wet etch or exhume operation) to form voids for access line formation. However, the one or more materials formed in the first trenches may provide a boundary (e.g., a restriction zone), that limits an extent of the material removal operation. Accordingly, one or more conductor materials associated with forming access lines of the memory device 100 may be excluded from at least some regions of the memory die, which may support a more compact configuration of features that improve the utilization of an area of the memory die associated with the memory device 100. In some examples, the formation of the one or more materials in the first trenches may be performed concurrently with other formation operations, such as operations for forming electrical contacts through the stack of alternating layers that also leverage the one or more materials (e.g., as a deposition or other formation of a dielectric material followed by a deposition of a conductive material). Thus, in some examples, isolation regions that support such etch stops may be formed with a minor increase in or no increase in a quantity of operations to form the memory device 100.

FIG. 2 illustrates an example of a memory architecture 200 that supports lateral etch stops for access line formation in a memory die in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-*a-ijk*). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-*a*-1 associated with memory cells 205-*a*-111 through 205-*a-mn*1. In some examples, each page 215 may be associated with a same word line 265, (e.g., a word line 165 described with reference to FIG. 1), which may be coupled with a control gate 115 of each of the memory cells 205 of the page 215. For example, page 215-*a*-1 may be associated with a word line 265-*a*-1, and other pages 215-*a-i* may be associated with a different respective word line 265-*a-i* (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-*a-mn* associated with memory cells 205-*a-mn*1 through 205-*a-mno*. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215, but may not be erasable (e.g., reset to a logic 1 value) in accordance with the granularity, such as the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may, in some cases, cause one or more aspects of the memory cell 205 (e.g., the dielectric material 125) to deteriorate. For example, charge trapping structure 120 may become unable to maintain a stored charge. Such deterioration may be an example of a wearout mechanism for a memory cell 205, and for this or other reasons, some memory cells 205 may support a finite quantity of program and erase cycles.

In accordance with examples as disclosed herein, a memory die formed in accordance with the memory architecture 200 may include one or more isolation regions that provide an etch stop (e.g., a lateral etch stop) to limit the extent of voids formed by removing a sacrificial material between layers of a dielectric region. For example, one or more first trenches may be formed through a stack of alternating layers of a dielectric material and a sacrificial material, in which one or more materials may formed (e.g., deposited). In some examples, one or more second trenches may be formed between the first trench and an array portion of the memory die (e.g., a region associated with a block 210), or between pairs of the first trenches, which may support the removal of at least a portion of the sacrificial material (e.g., in a wet etch or exhume operation) to form voids for access line formation (e.g., to form word lines 265). However, the one or more materials formed in the first trenches may provide a boundary that limits an extent of the material removal operation. Accordingly, one or more conductor materials associated with forming access lines of the memory architecture 200 may be excluded from at least some regions of the memory die (e.g., avoiding an indeterminate or otherwise variable extent of conductor materials), which may support a more compact configuration of features that improve the utilization of an area of the memory die associated with the memory architecture 200. In some examples, the formation of the one or more materials in the first trenches may be performed concurrently with other formation operations, such as operations for forming electrical contacts through the stack of alternating layers that also leverage the one or more materials (e.g., as a formation, such as a deposition or an oxidation, of a dielectric material followed by a formation, such as a deposition, of a conductive material, to form contacts between bit lines 250 and substrate-based or other operating circuitry that may be located between blocks 210 and a substrate). Thus, in some examples, isolation regions that support such etch stops may be formed a minor increase in or no increase in a quantity of operations to form the memory architecture 200.

Figure 3:
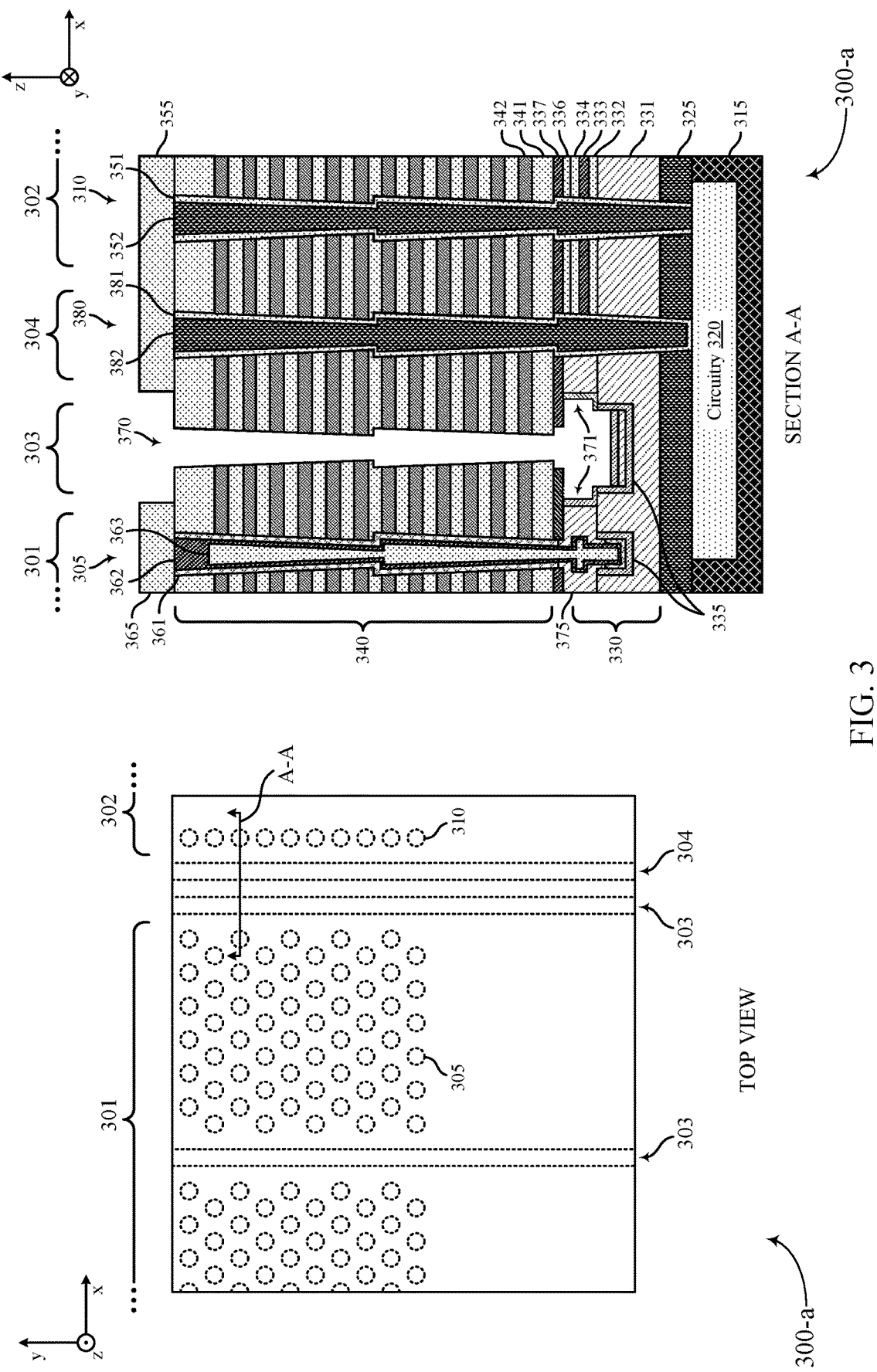
FIGS. 3 through 5 illustrate examples of fabrication operations that support lateral etch stops for access line formation in a memory die in accordance with examples as disclosed herein.
Figure 4:
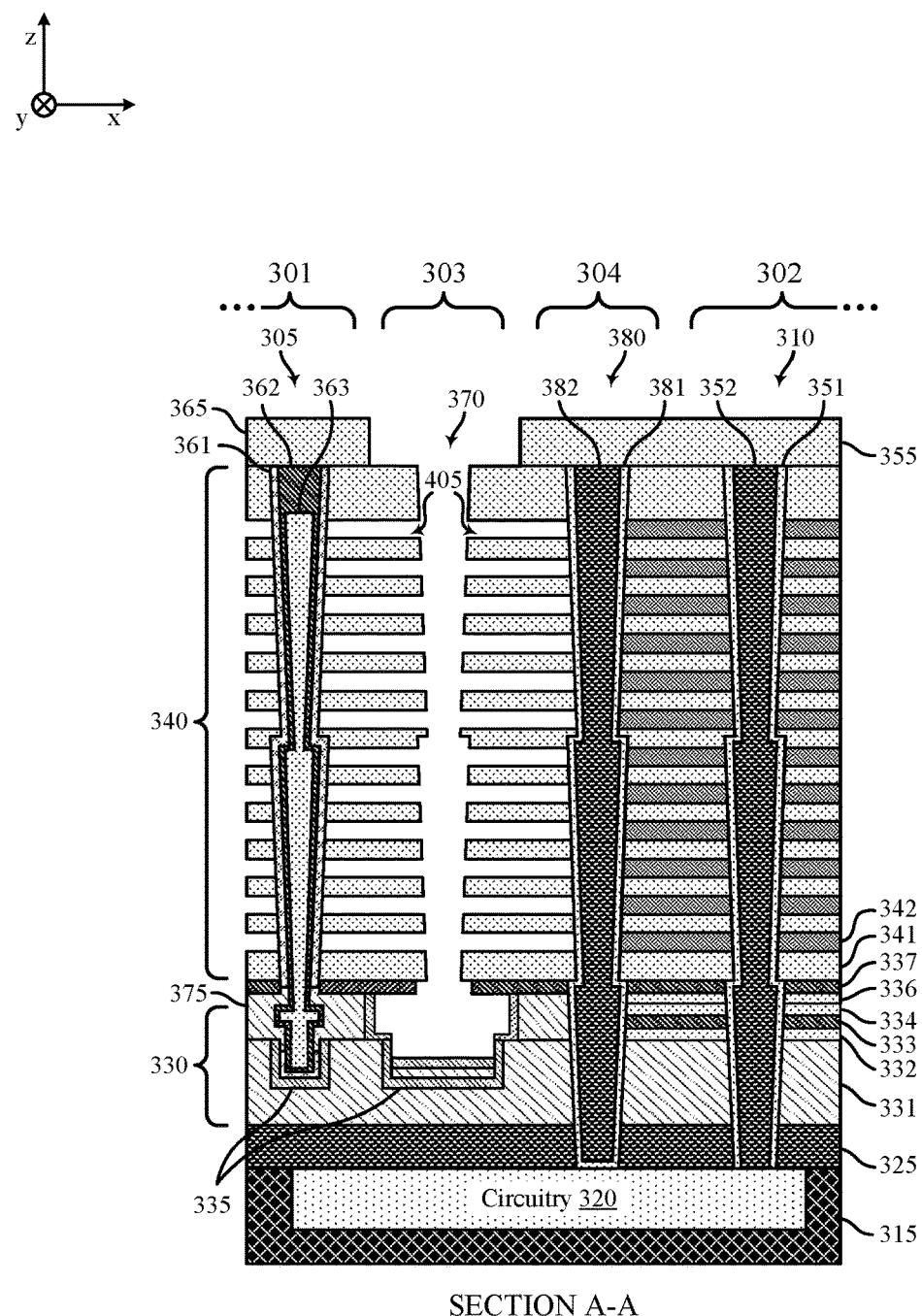
Figure 5:
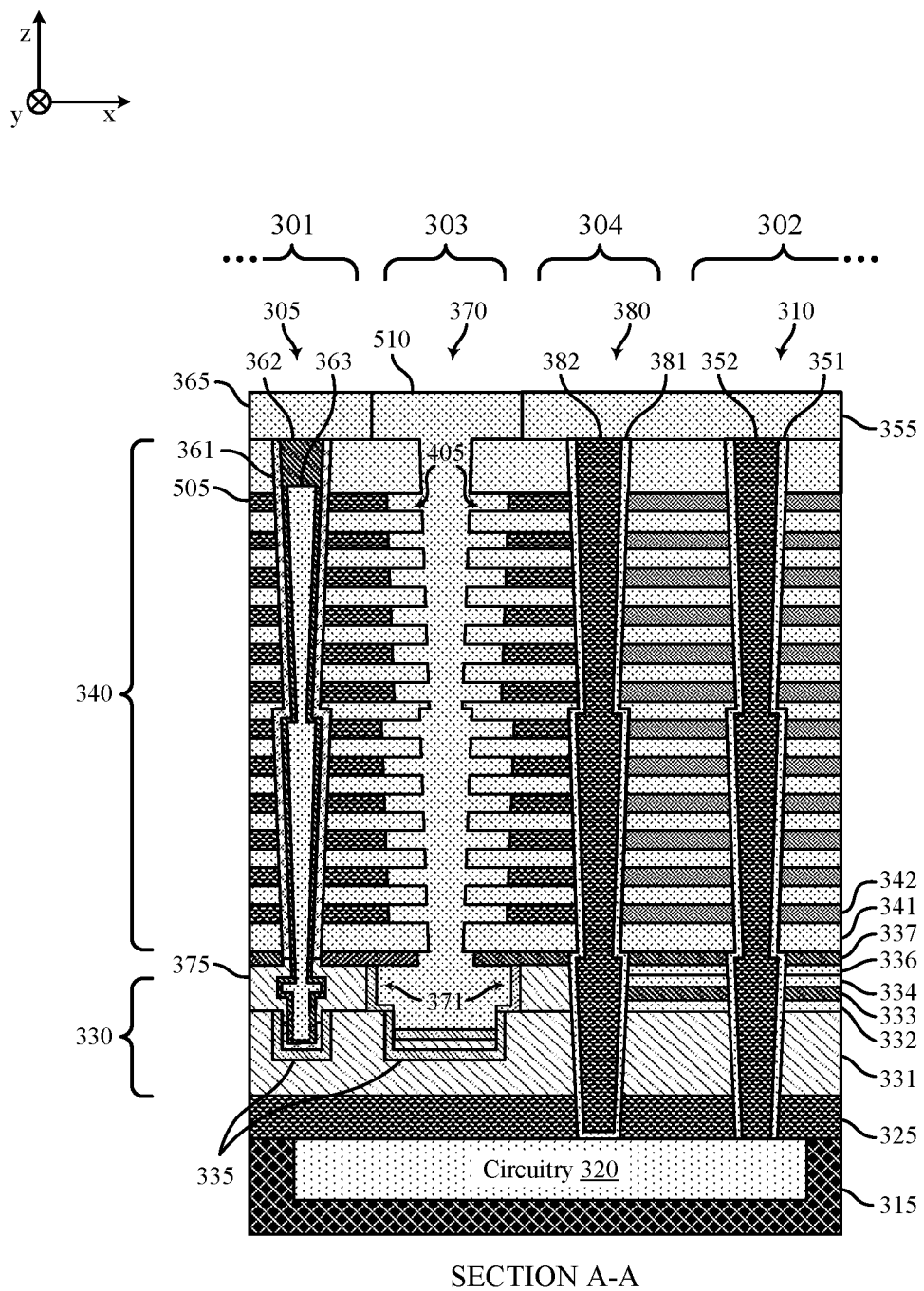

FIGS. 3 through 5 illustrate examples of fabrication operations that may support lateral etch stops for access line formation in a memory die in accordance with examples as disclosed herein. For example, FIGS. 3 through 5 may illustrate aspects of a sequence of operations for fabricating aspects of a material arrangement 300, which may be an example of implementing aspects of a memory architecture 200 described with reference to FIG. 2, among other types of memory architectures. Each of FIGS. 3 through 5 may illustrate aspects of the material arrangement 300 after different subsets of the fabrication operations for forming the material arrangement 300 (e.g., illustrated as a material arrangement 300-a after a first set of one or more manufacturing operations, as a material arrangement 300-b after a second set of one or more manufacturing operations, and so on). Each view of the figures may be described with reference to an x-direction, a y-direction, and a z-direction as illustrated, which may correspond to the respective directions described with reference to the memory architecture 200.

Some of the provided figures include section views that illustrate example cross-sections of the material arrangement 300. For example, in FIGS. 3 through 5, a view "SECTION A-A" may be associated with a cross-section in an xz-plane (e.g., in accordance with a cut plane A-A) through a portion of the material arrangement 300 associated with one or more cavities (e.g., including a cavity for a memory cell 205 and a cavity for an electrical contact through at least a portion of the material arrangement 300). Although the material arrangement 300 illustrates examples of relative dimensions and quantities of various features, aspects of the material arrangement 300 may be implemented with other relative dimensions or quantities of such features in accordance with examples as disclosed herein.

Operations illustrated in and described with reference to FIGS. 3 through 5 may be performed by a manufacturing system, such as a semiconductor fabrication system configured to perform additive operations such as deposition, conversion, oxidation, or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

FIG. 3 illustrates the material arrangement 300 (e.g., as a material arrangement 300-a) after a first set of one or more manufacturing operations. As illustrated, the material arrangement 300 may be associated with regions 301 (e.g., an array region, associated with one or more blocks 210), including pillars 305 that are associated with an array of memory cells 205, and regions 302 (e.g., a contact region), including contacts 310 (e.g., electrical contacts) that may convey signals associated with accessing the memory cells 205, each extending through at least a portion of the material arrangement 300 along the z-direction. In the material arrangement 300, at least some features of the regions 301 and regions 302 may be electrically isolated from one another, which may be supported by isolation regions 303 or isolation regions 304 (e.g., trench isolation regions), or various combinations thereof.

The first set of operations may include forming a layer of a material 325 (e.g., depositing the material 325 over a substrate 315), which may include a conductive material (e.g., a metal, a metal alloy, an electrically conductive ceramic such as tungsten silicide). In some examples, the layer of material 325 may support a ground node of a memory architecture 200, such as a source node of one or more blocks 210 (e.g., source lines 260, a common source). Although the layer of material 325 may be formed in contact with the substrate 315, in some other examples, the material arrangement 300 may include other materials or components between the layer of material 325 and the substrate 315. The substrate 315 may include or be otherwise associated with circuitry 320, which may include interconnection or routing circuitry (e.g., access lines, power routing lines), control circuitry (e.g., transistors, logic, decoding circuitry, addressing circuitry, aspects of a memory controller 180, a column decoder 150, a row decoder 160, a sense component 170, an input/output component 190), among other circuitry, which may include various conductor, semiconductor, or dielectric materials of the substrate 315, or between the layer of material 325 and the substrate 315, among other configurations. For example, the circuitry 320 may include an arrangement of complementary metal-oxide semiconductor (CMOS) transistors, or thin-film-transistors (TFTs), or any combination thereof between the substrate 315 and the layer of material 325, among others.

The first set of operations may also include forming a stack 330 (e.g., forming a stack of material layers, depositing a stack of material layers) over the substrate 315 (e.g., over the layer of material 325), which may support formation of various components that support the access of memory cells 205 (e.g., in regions 301). In some examples, the stack 330 may include a layer of a material 331, a layer of a material 332, a layer of a material 333, and a layer of a material 334. In some examples, the material 331 may be a semiconductor material (e.g., doped polysilicon, n+ doped polysilicon), which may support forming a channel portion of transistors 240. In some examples, each of the material 332, the material 333, and the material 334 may be a sacrificial material, at least a portion of which may be patterned and removed in later processing operations. In some examples, the material 332, the material 333, and the material 334 may be selected to support various techniques for differential processing (e.g., differential etching, high selectivity). For example, the material 332 may be a dielectric material (e.g., an oxide, an oxide of silicon, a liner oxide), the material 333 may be a semiconductor material (e.g., polysilicon), and the material 334 may be a dielectric material (e.g., an oxide, an oxide of silicon, a cap oxide) that may be the same as the material 332.

In some examples, the first set of operations may include operations that support forming etch stops in the stack 330 (e.g., vertical etch stops, to prevent material removal beyond the stack 330 in at least some regions of the material arrangement 300). For example, the first set of operations may include various operations for forming cavities aligned (e.g., in an xy-plane) with locations of the pillars 305, and forming trenches aligned along locations of the isolation regions 303. In some examples, such trenches may be connected with other such trenches (e.g., along the x-direction) to provide a trench isolation around each portion of the material arrangement 300 that is associated with a block 210 (e.g., enclosing an area in an xy-plane associated with a block 210, enclosing regions 301 or some portion thereof).

Such cavities and trenches may extend at least in part through the layer of the material 321, supporting the formation of a material 335 (e.g., oxidized doped polysilicon, which may include oxidizing the material 331) along the bottom and sidewalls of the cavities and trenches. In some examples, after forming etch stop features in the stack 330, the first set of operations may include forming (e.g., depositing, oxidizing) a layer of a material 336 and a layer of a material 337 over the stack 330. The material 336 may be an oxide material (e.g., an oxide of silicon), and the material 337 may be a semiconductor material (e.g., polysilicon). In some examples, the material 336 may be a sacrificial material (e.g., with portions removed in one or more later operations), and the material 337 may support formation of one or more transistor structures (e.g., as part of a channel of transistors 240 of the memory architecture 200).

The first set of operations also may include forming a stack 340 (e.g., forming a stack of material layers, depositing a stack of material layers), which may include various formation operations. For example, forming the stack 340 may include forming alternating layers of a material 341 and a material 342 (e.g., in accordance with alternating material deposition or other formation operations). In some examples, the material 341 may include a dielectric material (e.g., an oxide, a tier oxide, an oxide of silicon), which may provide electrical isolation between features of the material arrangement 300 (e.g., between pages 215, between word lines 265, along the z-direction). The material 342 may include various materials that are different than the material 341 (e.g., a nitride material, a nitride of silicon), and may be a sacrificial material (e.g., to support subsequent differential etching procedures). Although the stack 340 is illustrated with twenty five layers (e.g., thirteen layers of the material 341 and twelve layers of the material 342), a stack 340 in accordance with examples as disclosed herein may include any quantity of layers of each of two or more materials (e.g., tens of layers, hundreds of layers, and so on), including as few as one layer of the material 342.

The first set of operations also may include various operations for forming the contacts 310. For example, the first set of operations may include operations (e.g., dry etching operations, photolithography operations) for forming cavities through the stack 340 and the stack 330 in the regions 302 (e.g., exposing electrical contacts, such as conductive material portions, associated with the circuitry 320). Such cavities may be formed in various patterns associated with the contacts 310. In some examples, a cavity for a contact 310 may be aligned along the y-direction with a corresponding set of pillars 305 (e.g., a row of pillars 305 along the x-direction), which may support the contact 310 being coupled with a bit line 250 formed above (e.g., along the z-direction) the corresponding set of pillars 305. However, contacts 310 may be formed in a region 302 for other purposes, and accordingly may be arranged in various other configurations. The cavities may be formed via openings (e.g., cross-sectional openings, openings in an xy-plane) that are non-overlapping with one another (e.g., in an xy-plane). Forming cavities for the contacts 310 may be associated with forming (e.g., exposing) sidewalls of one or more materials of the stack 340 and of the stack 330, and such sidewalls may have a shape that is tapered along the z-direction.

Although, in some examples, cavities for contacts 310 may be formed through the stack 340 and the stack 330 in a single material removal operation, in some other examples, such cavities may be formed using a sequence of material removal operations. For example, for each contact 310, a respective first cavity may be formed through at least the stack 330 and, in some examples, one or both of the material 336 or the material 337, and the first cavity may be filled with a sacrificial material (e.g., sacrificial carbon, with or without a liner material, or a stack of different materials). In some examples, such operations may be performed before forming the stack 340. A respective second cavity, aligned with the respective first cavity (e.g., coaxial along the z-direction, in accordance with an alignment tolerance in an xy-plane), may be formed through at least a subset of material layers of the stack 340 (e.g., before forming another subset of material layers of the stack 340), and the second cavity may be filled with a sacrificial material (e.g., coincident with previously-formed sacrificial material, over which another subset of material layers of the stack 340 may be formed). Such a sequence may be repeated for any quantity of iterations and a single, collective cavity for each contact 310 may be formed by removing the sacrificial material from the earlier cavity fill operations.

After forming such cavities, the contacts 310 may formed at least in part by forming (e.g., depositing) a conductive material in the cavities. In some examples, such operations may include forming (e.g., depositing, oxidizing) a material 351, which may include a dielectric material (e.g., an oxide, an oxide of silicon). In examples that include the material 351, the material 351 may be removed from a bottom portion of the cavities to expose the respective contacts of the circuitry 320. Forming the contacts 310 may then include forming a material 352 (e.g., in contact with or otherwise electrically coupled with the circuitry 320), which may include forming (e.g., depositing) a conductive material (e.g., a metal, a metal alloy, tungsten, tungsten silicide). In some examples, the material 352 may be the same as the material 325. In some examples, after forming the contacts 310, the first set of operations may include forming a layer of a material 355 (e.g., a dielectric material, an oxide of silicon) over the stack 340, which may provide a barrier that protects the contacts 310 during subsequent operations.

The first set of operations also may include various operations for forming the pillars 305. For example, the first set of operations may include operations (e.g., dry etching operations, photolithography operations) for forming cavities through the stack 340 and through at least a portion of the stack 330 in regions 301 (e.g., exposing a portion of the material 325, using the material 325 as a cavity etch stop). Such cavities may be formed in a pattern associated with the pillars 305 (e.g., in rows along the x-direction), which may include a staggering of rows to improve density of pillars 305 (e.g., in an xy-plane). The cavities may be formed via openings that are non-overlapping with one another, and forming such cavities may be associated with forming sidewalls of one or more materials of the stack 340 and of the stack 330. In some examples, one or more operations associated with forming cavities for the pillars 305 may be performed concurrently with corresponding operations associated with forming cavities for the contacts 310 (e.g., etching operations, sacrificial material deposition operations).

Although, in some examples, such cavities may be formed through at least the stack 340 in a single material removal operation, in some other examples, such cavities may be formed using a sequence of material removal operations. For example, for each pillar 305, a respective first cavity may be formed through a first subset of material layers of the stack 340, and the first cavity may be filled with a sacrificial material (e.g., before forming a second subset of material layers of the stack 340). A respective second cavity, aligned with the respective first cavity, may be formed through a second subset of material layers of the stack 340, and the second cavity may be filled with a sacrificial material. Such a sequence may be repeated for any quantity of iterations and a single, collective cavity for each pillar 305 may be formed by removing the sacrificial material from the earlier cavity fill operations After forming such cavities, the formation of pillars 305 may include various operations that support forming memory cells (e.g., memory cells 105, memory cells 205, memory cells of a string 220) associated with the pillars 305. For example, the first set of operations may include forming (e.g., depositing, oxidizing) at least a material 361 and a material 362, and, in some examples, a material 363 in the formed cavities associated with the pillars 305. The material 361 may support a charge-trapping function of memory cells 205 and, in various examples, may include one or more layers of material. In some examples, the material 361 may include a first layer (e.g., a dielectric layer, an oxide layer, an oxide of silicon) in contact with walls of the formed cavities, which may support first dielectric materials 125 of a string of memory cells 205, a second layer (e.g., a charge-trapping layer, a nitride layer, a nitride of silicon) over the first layer, which may support charge trapping structures 120 of the string of memory cells 205, and a third layer (e.g., a dielectric layer, an oxide layer, an oxide of silicon) over the second layer, which may support second dielectric materials 125 of the string of memory cells 205. The material 362 may be a semiconductor material (e.g., polysilicon, in contact with the material 361 or third layer thereof), which may support channel portions of the string of memory cells 205 (e.g., between respective first nodes 130 and second nodes 135). The material 363 may be a dielectric material (e.g., silicon oxide, in contact with the material 362) which, in some examples, may fill a remainder of the cavities. In some examples, a portion of at least the material 363 may be removed (e.g., recessed) from the top of the pillars 305 and an additional portion of the material 362 may be formed (e.g., deposited, oxidized) to fill the top portions of the pillars 305 (e.g., in a plug formation operation). In some examples, after forming the pillars 305, the first set of operations may include forming a layer of a material 365 (e.g., a dielectric, material an oxide of silicon) over the stack 340, which may provide a barrier that protects the pillars 305 during subsequent operations.

The first set of operations also may include various operations (e.g., dry etching operations, photolithography operations) for forming trenches 370 through the stack 340 and through at least a portion of the stack 330 along the isolation regions 303 (e.g., exposing a portion of the material 325, using the material 325 as a trench etch stop). In some examples, one or more operations associated with forming trenches 370 for the isolation regions 303 may be performed concurrently with corresponding operations associated with forming cavities for the pillars 305 (e.g., etching operations, sacrificial material deposition operations). Although, in some examples, trenches 370 may be formed through at least the stack 340 in a single material removal operation, in some other examples, trenches 370 may be formed using a sequence of material removal operations. For example, for each isolation region 303, a respective first trench may be formed through a first subset of material layers of the stack 340, and the first trench may be filled with a sacrificial material (e.g., before forming a second subset of material layers of the stack 340). A respective second trench, aligned with the respective first trench, may be formed through a second subset of material layers of the stack 340, and the second trench may be filled with a sacrificial material. Such a sequence may be repeated for any quantity of iterations and a trench 370 may be formed by removing the sacrificial material from the earlier trench fill operations. In some examples, forming trenches 370 may involve removing at least a portion of the material 355, or the material 365, from the isolation regions 303.

Opening the trenches 370 may support formation of structures associated with the pillars 305. For example, voids 371 may be formed via the trenches 370, which may include removing (e.g., via a wet etching operation) exposed portions of the material 332, the material 333, the material 334, the material 336, and the material 361. In some examples, such operations may be preceded by forming a liner material (not shown) on surfaces of the stack 340 associated with the trenches 370, which may prevent removal of the material 341 and the material 342 during such operations. A material 375 may be formed in the voids 371, which may further support forming aspects of transistors 240. For example, the material 375 may include a semiconductor material (e.g., a doped polysilicon material, an n+ doped polysilicon material), which may be the same as the material 331. In some examples, after forming the material 375, a liner along the trench 370 may be removed, and exposed surfaces of the material 331 and the material 375 may be oxidized to form additional portions of the material 335.

In some examples, forming word lines 265 in the material arrangement 300 may involve forming voids by removing portions of the material 342 from the stack 340 in the regions 301, and forming one or more conductive materials in the formed voids. However, with some techniques for forming such voids, the extents of the removal of the material 342 (e.g., along the x-direction, along the y-direction) may be indeterminate or otherwise difficult to control due to variations in material removal rates and different material removal dimensions. Thus, in some examples, voids may extend into regions 302, among other regions (e.g., between adjacent regions 301 that are intended to be electrically isolated), which may allow conductive materials to be adversely formed near the contacts 310, or between contacts 310 and pillars 305, among other features of the material arrangement that are intended to be electrically isolated. Although, in some examples, contacts 310 may be located relatively far from trenches 370 to avoid adverse coupling with the conductive material, among other techniques to compensate for an indeterminate or otherwise variable extent of voids and conductor deposition, such techniques may be associated with relatively inefficient utilization of an area (e.g., in an xy-plane) of the material arrangement 300.

In accordance with examples as disclosed herein, the material arrangement 300 may include isolation regions 304, which may support a lateral etch stop functionality that limits or impedes a propagation of the removal of the material 342, thereby limiting an extent of one or more conductive materials associated with the formation of one or more access lines in the material arrangement 300. Thus, by including isolation regions 304, features intended to be electrically isolated may be formed closer to isolation regions 303 (e.g., closer to trenches 370, such as a reduced distance between contacts 310 or pillars 305 and trenches 370) without being adversely affected by the one or more conductive materials, which may improve the utilization of the area (e.g., in an xy-plane) of the material arrangement 300 and improve the throughput of forming the associated memory architecture.

To form features of the isolation regions 304, the first set of operations may include operations (e.g., dry etching operations, photolithography operations) for forming trenches 380 through at least the stack 340 and, in some examples, through the stack 330 and the layer of material 325, along the isolation regions 304. In some examples, one or more operations associated with forming trenches 380 for the isolation regions 304 may be performed concurrently with corresponding operations associated with forming cavities for the contacts 310 (e.g., etching operations, sacrificial material deposition operations). Although, in some examples, trenches 380 may be formed in a single material removal operation, in some other examples, trenches 380 may be formed using a sequence of material removal operations, in accordance with examples as disclosed herein (e.g., as described with reference to forming contacts 310).

After forming trenches 380, an etch stop feature may be formed by forming (e.g., depositing, oxidizing) one or more materials in the trenches 380. In some examples, such operations may include forming (e.g., depositing, oxidizing) a material 381, which may include a dielectric material (e.g., an oxide, an oxide of silicon), followed by forming (e.g., depositing) a material 382, which may include a conductive material (e.g., a metal, a metal alloy, tungsten, tungsten silicide). In some examples, the material 381 may be the same as the material 351, and the material 382 may be the same as the material 352, such that respective formation operations may be performed concurrently (e.g., forming the isolation regions 304 concurrently with forming the contacts 310). However, in some examples, a material 381 may remain at the bottom of trenches 380, which may support an electrical isolation between the material 382 and the circuitry 320.

FIG. 4 illustrates the material arrangement 300 (e.g., as a material arrangement 300 b) after a second set of one or more manufacturing operations, as a cross-sectional side view (e.g., relative to the cut plane A-A). The second set of operations may include operations (e.g., wet etching operations, exhuming operations) that support forming word lines 265 in the regions 301. For example, the second set of operations may include forming voids 405 between layers of the material 341 by removing the material 342 from portions of the stack 340 (e.g., in the regions 301). Forming the voids 405 may expose portions of the pillars 305 (e.g., exposing sidewalls of the material 361 between layers of the material 341), which may remain in contact with the material 341 and support the material 341 across the voids 405 (e.g., along the z-direction) for the formation of word lines (e.g., word lines 265), among various structures of the memory architecture 200. In some examples, the voids 405 may extend as far as the isolation regions 304, which may include exposing sidewalls of the material 381 between the layers of the material 341. However, by including isolation regions 304, the voids 405 may not extend into the regions 302 (e.g., such that layers of the material 342 of the stack 340 may remain in the regions 302), which may prevent the formation of conductive materials in the regions 302 during formation of the word lines 265.

FIG. 5 illustrates the material arrangement 300 (e.g., as a material arrangement 300-c) after a third set of one or more manufacturing operations, as a cross-sectional side view (e.g., relative to the cut plane A-A). The third set of operations may include further operations (e.g., one or more deposition operations, metal fill operations, etching operations) that support forming word lines 265 between layers of the material 341 (e.g., in portions of the voids 405). For example, the third set of operations may also include forming (e.g., depositing) a material 505 in the voids 405 (e.g., between layers of material 341), which may include forming the material 505 in contact with or otherwise electrically coupled with the pillars 305 (e.g., in contact with the material 361). The material 505 may include one or more conductive materials, such as tungsten, which may be the same as the material 325, material 351, or the material 381, or any combination thereof. In some examples, forming the material 505 may include forming (e.g., depositing, oxidizing) a dielectric material (e.g., aluminum oxide) in contact with the pillars 305 (e.g., in contact with the material 361, before depositing one or more conductive materials), which may support a dielectric function of memory cells 205 (e.g., a dielectric material 125). Portions of the material 505 may be removed (e.g., in a recess etch operation) from portions of the voids 405 to provide electrical isolation between word lines 265.

The third set of operations also may include operations (e.g., one or more deposition operations, one or more oxidation operations) that support forming an electrical isolation in the isolation regions 303 based at least in part on forming (e.g., depositing, oxidizing) a material 510 in regions 303 (e.g., in the trenches 370 and at least some portion of the voids 405). The material 510 may be a dielectric material (e.g., an oxide, an oxide of silicon) which may be the same as the material 355 or the material 365, among other materials of the material arrangement 300.

The third set of operations may be followed by other operations to support aspects of the memory architecture 200, such as forming bit lines 250 coupled with the strings 220 (e.g., conductive lines over the material arrangement 300-c, which may be aligned along the x-direction and operable for coupling between the material 362 and the material 352), and forming vertical contacts (e.g., vertical conductors) coupled with each of the word lines 265 (e.g., contacts electrically coupled with respective layers of material 505), among other features.

Figure 6:
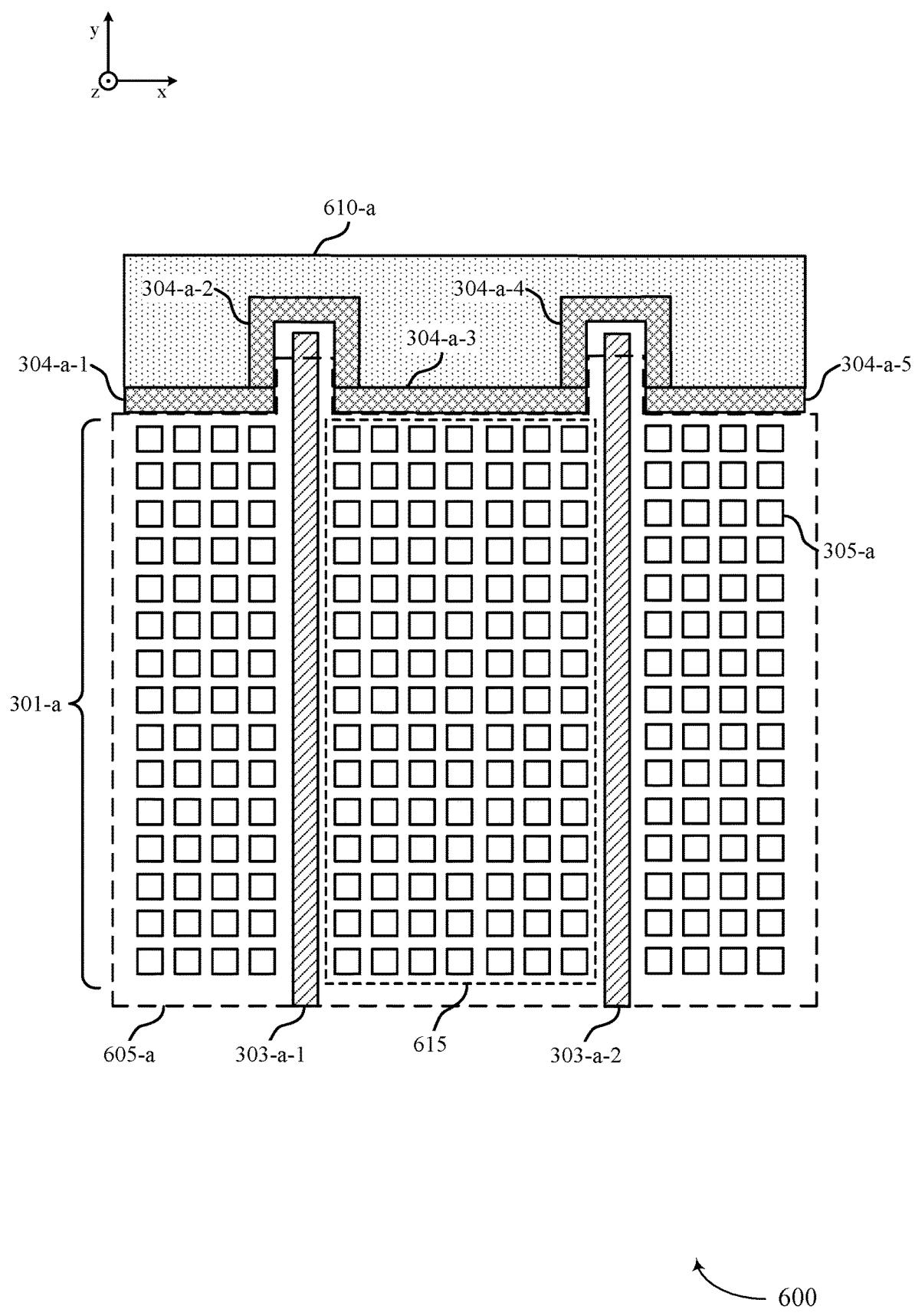
FIGS. 6 through 8 illustrate examples of layouts that support lateral etch stops for access line formation in a memory die in accordance with examples as disclosed herein.

FIG. 6 illustrates an example of a layout 600 that supports lateral etch stops for access line formation in a memory die in accordance with examples as disclosed herein. The layout 600 may be an example of implementing one or more aspects of the material arrangement 300. The layout 600 may be implemented in a memory die, which may include a stack of material layers (e.g., at least a stack 340 as described with reference to FIG. 3, layers of materials stacked along the z-direction).

The layout 600 may include a region 301-a (e.g., an array region of the memory die), which may include an array of pillars 305-a (e.g., associated with an array of memory cells 205, associated with one or more blocks 210) that may extend through the stack of material layers of the region 301-a. In some examples, the layout 600 may include isolation regions 303-a-1 and 303-a-2, which may, in some implementations, be non-coincident (e.g., parallel). In some examples, formation of the isolation regions 303-a may include forming respective trenches 370, which may be used to form voids (e.g., voids 405) between dielectric layers of the stack of materials that support forming access lines (e.g., word lines 265) by forming (e.g., depositing) one or more materials (e.g., a material 505) in the formed voids. In some examples, the isolation regions 303-a may separate pillars 305 into different blocks of memory cells 205 that may be independently accessed.

The layout 600 may also include isolation regions 304-a, which may support lateral etch stops to limit a propagation of voids 405 formed through the stack of material layers. In some examples, adjacent isolation regions 304-a may be contiguous with one another, such that the individually referenced isolation regions 304-a may form or be otherwise referred to as a continuous isolation region 304. In some examples, formation of the isolation regions 304-a may include forming respective trenches 380, within each of which one or more materials may be formed to limit a progression of a removal of a sacrificial material (e.g., an etching of a material 342). The region 301-a may include an array region 615, which may be associated with a block 210 or a plane of memory cells. The isolation region 304-a-3 may be aligned along a first side (e.g., a top side, along the x-direction) of the array region 615, the isolation region 303-a-1 may be aligned along a second side of array region 615 (e.g., a left side, along the y-direction), and the isolation region 303-a-2 may be aligned along a third side of the array region 615 (e.g., a right side, along the y-direction) opposite isolation region 303-a-1. As shown, the isolation regions 304-a may be non-coincident with isolation regions 303-a-1 and 303-a-2. For example, isolation regions 304-a-2 and 304-a-4 and may wrap around ends of isolation regions 303-a-1 and 303-a-2 (e.g., ends along the y-direction), which may avoid asymmetries or inconsistencies of forming features that may otherwise result from isolation regions 303-a being coincident with isolation regions 304-a (e.g., avoiding corner intersections that may be rounded as a result of material removal operations).

The isolation regions 304-a may block formation of voids 405 and subsequent formation of conductor materials (e.g., material 505, to form word lines 265), which may be associated with a boundary 605-a. The boundary 605-a may be an illustrative boundary in the xy-plane of a material removal operation, such as a boundary of at least the voids 405. In some examples, the boundary 605-a may also be an illustrative boundary in the xy-plane of a conductor deposition operation, such as a boundary of depositing a material 505. Because the boundary 605-a may be configured based on the location of isolation regions 304-a, discrete live contacts or pillars outside of the boundary 605-a (e.g., relative to trenches 370) that are meant to be electrically isolated (e.g., from word lines 265 or other features) may not be coupled with a material 505. In some cases, as a result of forming isolation regions 304-a, a region 610-a may remain outside of boundary 605-a, such that voids 405 and word lines 265 may not be formed in the region 610-a. In some cases, region 610-a may be an example of region 302. For example, region 610-a may be used for electrical contacts (e.g., through a stack of material layers) or other purposes.

In some cases, isolation regions 304-a may form a continuous ring around at least the array region 615, or the array region 310-a. For example, isolation region 304—as may form an enclosure outside which a material 505 does not propagate. In this case, region 610-a may be located outside the enclosure formed by the continuous isolation region 304-a. Multiple enclosing isolation regions 304-a may be used for double walls or a controlled region within the region 301-a, which may be used to form contacts (e.g., through the stack of material layers, not shown) in the region 301-a.

Thus, the layout 600 illustrates an example of a memory die that includes an array region (e.g., an array region 615) with a plurality of pillars (e.g., pillars 305-a) that extend through a stack of material layers (e.g., at least a stack 340), where at least the array region may include alternating layers of a dielectric material (e.g., a material 341) and one or more conductive materials (e.g., a material 505). Such a memory die may also include a first isolation region (e.g., isolation region 303-a-1) extending through the stack of material layers and aligned along a first side of the array region, and a second isolation region (e.g., isolation region 303-*a*-2) extending through the stack of material layers aligned along a second side of the array opposite the first side, each of which may include a dielectric material in contact with the layers of the conductive materials.

A memory die may also include a third isolation region (e.g., isolation region 304-*a*-3) between the first isolation region and the second isolation region and extending through the stack of material layers. The third isolation region may include a dielectric material in contact with the layers of the conductive materials, which may be separated from (e.g., physically separated from) the dielectric material of the first isolation region and the dielectric material of the second isolation region. In some cases, one or more conductive materials may extend between the first isolation region and the third isolation region (e.g., along the y-direction), between the second isolation region and the third isolation region (e.g., along the y-direction), or some combination. In some cases, a fourth isolation region (e.g., an isolation region 304-*a*-2, an isolation region 304-*a*-4) may intersect with the third isolation region and around an end of the first isolation region, the second isolation region, or both, where the fourth isolation region also may include a dielectric material.

Figure 7:
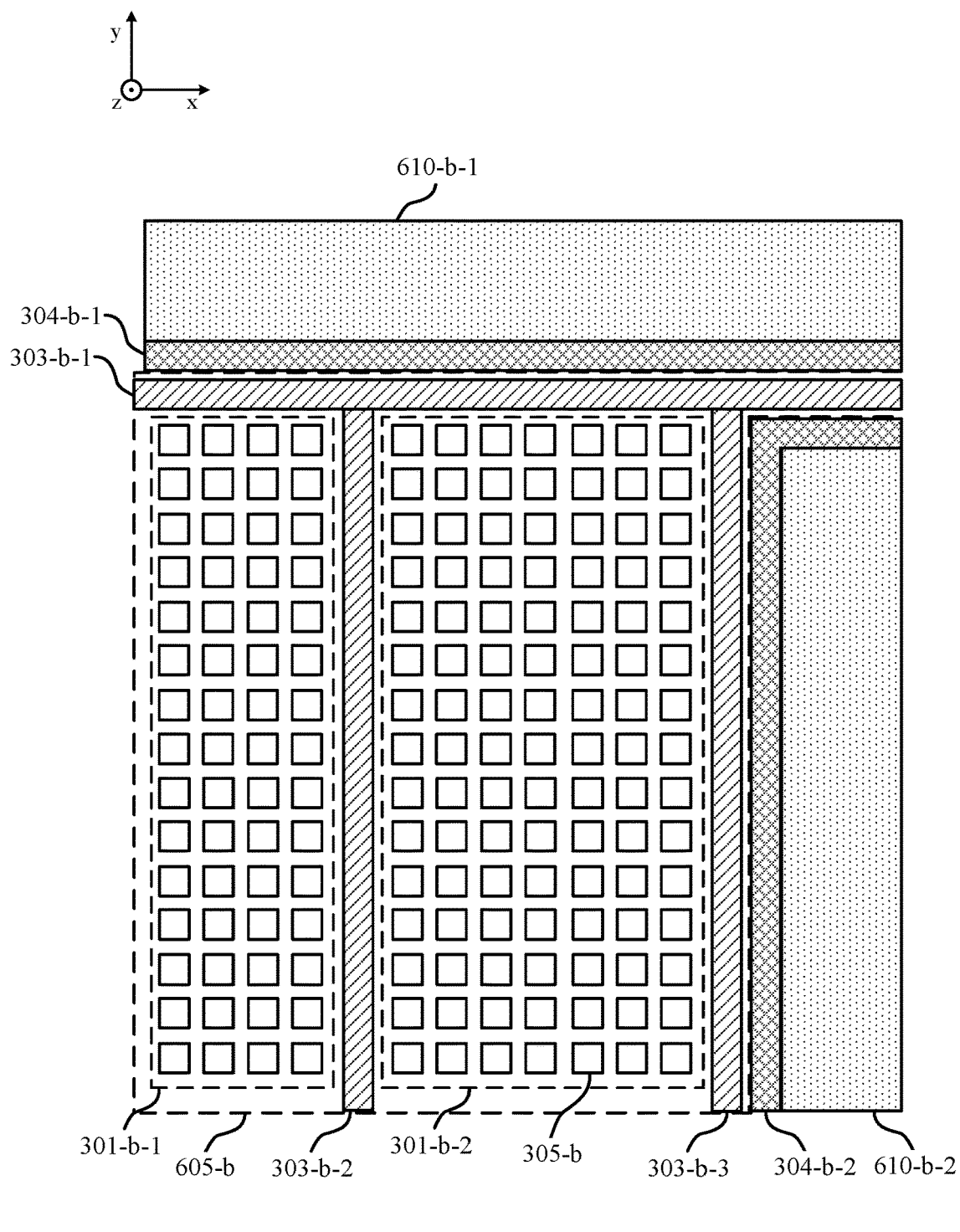

FIG. 7 illustrates an example of a layout 700 that supports lateral etch stops for access line formation in a memory die in accordance with examples as disclosed herein. The layout 700 may be an example of implementing one or more aspects of the material arrangement 300. The layout 700 may be implemented in a memory die, which may include a stack of material layers (e.g., at least a stack 340 as described with reference to FIG. 3, layers of materials stacked along the z-direction).

The layout 700 may include regions 301-*b*-1 and 301-*b*-2, which each may include an array of pillars 305-*b* (e.g., associated with an array of memory cells 205, associated with one or more blocks 210). In some examples, the layout 700 may include isolation regions 303-*b*-1, 303-*b*-2, and 303-*b*-3, which may be coincident (e.g., intersecting). For example, isolation region 303-*b*-1 may intersect with isolation regions 303-*b*-2 and 303-*b*-3, and isolation regions 303-*b*-2 and 303-*b*-3 may be non-coincident (e.g., parallel) with each other. In some examples, isolation regions 303-*b* may be formed separately, and in other examples isolation regions 303-*b* may be formed concurrently. In some cases, isolation region 303-*b*-2 may be between subsets of the pillars 305-*b* and may separate regions 301-*b*-1 and 301-*b*-2. In some examples, formation of the isolation regions 303-*b* may include forming respective trenches 370, which may be used to form voids (e.g., voids 405) between dielectric layers of the stack of materials that support forming access lines (e.g., word lines 265) by forming (e.g., depositing) one or more materials (e.g., a material 505) in the formed voids. In some examples, the isolation region 303-*b*-2 may separate pillars 305-*b* into different blocks of memory cells 205 that may be independently accessed. In some cases, a trenches 370 associated with the isolation regions 303 may be coincident with one another.

The layout 700 also may include isolation regions 304-*b*, which may support lateral etch stops to limit a propagation of voids 405 formed through the stack of material layers. In some cases, the isolation region 304-*b*-1 may be non-coincident with isolation region 304-*b*-2. In the example of layout 700, isolation regions 304-*b* may be non-coincident with isolation regions 303-*b*. The isolation regions 304-*b* may block formation of voids 405 and subsequent formation of conductor materials (e.g., material 505, to form word lines 265), which may be associated with a boundary 605-*b*. The boundary 605-*b* may be an illustrative boundary in the xy-plane of a material removal operation (e.g., a boundary of at least the voids 405) or an illustrative boundary in the xy-plane of a conductor deposition operation (e.g., a boundary of depositing a material 505). Because boundary 605-*b* may be configured based on the location of isolation regions 304-*b*, discrete live contacts or pillars outside of boundary 605-*b* (e.g., relative to trenches 370) that are meant to be electrically isolated (e.g., from word lines 265 or other features) may not be coupled with a material 505. In some cases, as a result of forming isolation regions 304-*b*, regions 610-*b* may remain outside of the boundary 605-*b*, such that voids 405 and word lines 265 may not be formed in the regions 610-*b*. In some cases, regions 610-*b* may be examples of regions 302. For example, regions 610-*b* may be used for electrical contacts (e.g., through a stack of material layers) or other purposes.

The layout 700 may illustrate a relatively efficient implementation of lateral etch stops in accordance with examples as disclosed herein. For example, by avoiding portions of isolation regions 304 that wrap around ends of isolation regions 303 (e.g., isolation regions 304-*a*-2 and 304-*a*-4 of layout 600), regions 610-*b*-1 and 610-*b*-2 may be relatively larger, supporting more area (e.g., in an xy-plane) for other functional elements of the related memory die. However, in some examples, forming intersecting isolation regions 303-*b* (e.g., in accordance with corner intersections) may be associated with inconsistencies or asymmetries in the layout 700. For example, although illustrated as right angle intersections, the implementation of intersecting isolation regions 303-*b* may be subject to rounding effects (e.g., where intersections are associated with excess material removal at corners), which may impair formation or functionality of certain pillars 305-*b* or other structures that are near such intersections.

The layout 700 illustrates an example of a memory die that may include an array region (e.g., regions 301-*b*) with a plurality of pillars (e.g., pillars 305-*b*) that extend through a stack of material layers (e.g., at least a stack 340), where at least the array region may include alternating layers of a dielectric material (e.g., a material 341) and one or more conductive materials (e.g., a material 505). Such a memory die may also include a first isolation region (e.g., isolation region 304-*b*-1, isolation region 304-*b*-2) extending through the stack of material layers and aligned along a first side of the array region, which may include a dielectric material in contact with the layers of the conductive materials. Such a memory die may also include a second isolation region (e.g., isolation region 303-*b*-1, isolation region 303-*b*-3) extending through the stack of material layers and between the array region and the first isolation region, which may include a dielectric material in contact with the layers of the conductive materials.

Figure 8:
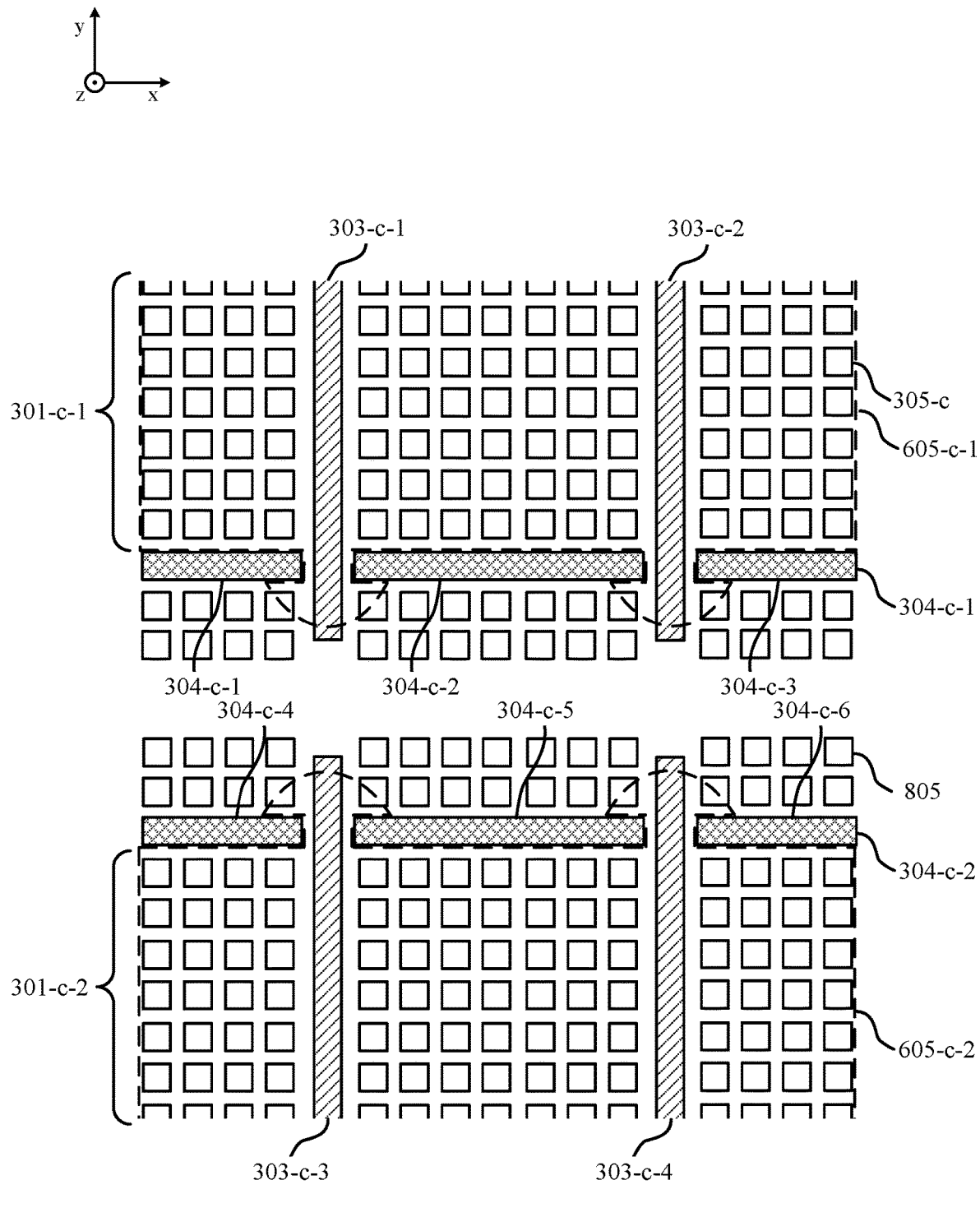

FIG. 8 illustrates an example of a layout 800 that supports lateral etch stops for access line formation in a memory die in accordance with examples as disclosed herein. The layout 800 may be an example of implementing one or more aspects of the material arrangement 300. The layout 800 may be implemented in a memory die, which may include a stack of material layers (e.g., at least a stack 340 as described with reference to FIG. 3, layers of materials stacked along the z-direction).

The layout 800 may include regions 301-*c*-1 and 301-*c*-2 (e.g., one or more array regions of the memory die), which may include an array of pillars 305-*b* (e.g., associated with an array of memory cells 205, associated with one or more blocks 210) which may extend through the stack of material layers of the region 301-a). In some examples, the layout 800 may include isolation regions 303-c-1, 303-c-2, 303-c-3, and 303-c-4. For example, isolation regions 303-c-1 and 303-c-2 may be non-coincident and isolation regions 303-c-3 and 303-c-4 may be non-coincident. In some cases, isolation regions 303-c-1 and 303-c-2 may be opposite and non-coincident with isolation regions 303-c-3 and 303-c-4. In some cases, isolation regions 303-c-1 and 303-c-2 may be between subsets of the pillars 305-c of region 301-c-1 and isolation regions 303-c-3 and 303-c-4 may be between subsets of the pillars 305-c of region 301-c-2. In some examples, formation of the isolation regions 303-c may include forming respective trenches 370, which may be used to form voids (e.g., voids 405) between dielectric layers of the stack of materials that support forming access lines (e.g., word lines 265) by forming (e.g., depositing) one or more materials (e.g., a material 505) in the formed voids. In some examples, the isolation regions 303-c may separate pillars 305-b into different planes of memory cells 205 that may be independently accessed.

The layout 800 also may include isolation regions 304-c, which may support lateral etch stops to limit (e.g., reduce, constrain) a propagation of voids 405 formed through the stack of material layers. In some examples, formation of the isolation regions 304-c may include forming respective trenches 380, which may be filled with one or more materials that limit a progression of a removal of a sacrificial material (e.g., a material 342). In some examples, isolation regions 304-c may be aligned along a first side of regions 301-c (e.g., array regions). For example, isolation regions 304-c-1, 304-c-2, and 304-c-3 may be aligned with the bottom of region 301-c-1 in the xy-plane, and isolation regions 304-c-4, 304-c-5, and 304-c-6 may be aligned with the top of region 301-c-2 in the xy-plane. In some cases, isolation regions 304-c may be non-continuous with one another, and isolation regions 304-c may be non-coincident with isolation regions 303-c. In some cases, isolation regions 304-c may at least partially form a boundary of a plane on the memory die without a continuous isolation region 304 ring.

The isolation regions 304-c may limit an extent of voids 405 and subsequent formation of conductor materials (e.g., material 505, to form word lines 265), which may be associated with boundaries 605-c. The boundaries 605-c may be illustrative boundaries in the xy-plane of a material removal operation, such as a boundary of at least the voids 405. In some examples, the boundaries 605-c may also be an illustrative boundary in the xy-plane of a conductor deposition operation, such as a boundary of depositing a material 505. In the example of layout 800, because isolation regions 303-c and isolation regions 304-c are non-coincident, the boundaries 605-c may extend between the isolation regions 303-c and the isolation regions 304-c (e.g., along the y-direction). However, the gaps between isolation regions 303 (e.g., trenches 370) and isolation regions 304 (e.g., material 381) may be relatively narrow, which may impede a flow associated with removing material 342 (e.g., may impede a flow of an etching solution (e.g., compared with a configuration without isolation regions 304). Thus, the example of layout 800 may include dummy pillars 805 that are not intended to be active pillars (e.g., pillars 305-c). Such techniques may improve consistency and symmetry by avoiding intersections among isolation regions (e.g., coincident trench portions intersecting at a corner), or by applying a regular pattern of operations for pillars 305-c and dummy pillars 805, or both. However, the dummy pillars 805 may occupy an area (e.g., in the xy-plane) that is accordingly unavailable for other active structures of the memory die.

Thus, the layout 800 illustrates an example of a memory die that may include an array region (e.g., regions 301-c, or portions thereof) with a plurality of pillars (e.g., pillars 305-c) that extend through a stack of material layers (e.g., at least a stack 340), where at least the array region may include alternating layers of a dielectric material (e.g., a material 341) and one or more conductive materials (e.g., a material 505). Such a memory die may also include a first isolation region (e.g., isolation regions 303-c-1 and 303-c-3) extending through the stack of material layers and aligned along a first side of the regions 301-c and a second isolation region (e.g., isolation regions 303-c-2 and 303-c-4) extending through the stack of material layers aligned along a second side of the regions 301-c opposite the first side (e.g., the right side of the xy-plane), each of which may include a dielectric material in contact with the layers of the conductive materials. Such a memory die may also include a third isolation region (e.g., isolation regions 304-c-2 and 304-c-5) between the first isolation region and the second isolation region and extending through the stack of material layers. The third isolation region may include a dielectric material in contact with the layers of the conductive materials, which may be physically separated from the dielectric material of the first isolation region and the dielectric material of the second isolation region. In some cases, one or more conductive materials may extend between the first isolation region and the third isolation region, between the second isolation region and the third isolation region, or both (e.g., along the y-direction, in accordance with boundaries 605-c.

Figure 9:
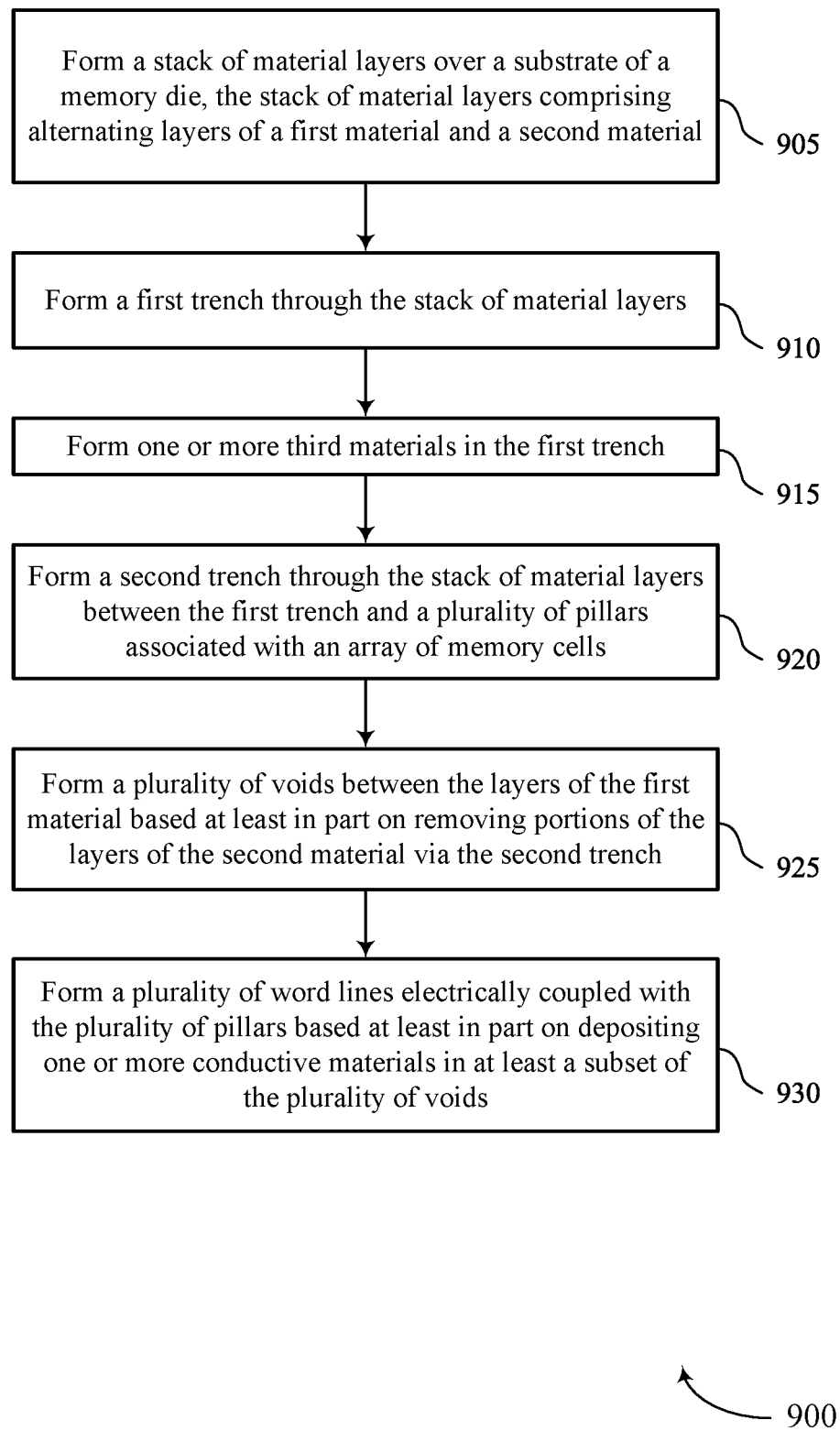
FIGS. 9 and 10 show flowcharts illustrating methods that support lateral etch stops for access line formation in a memory die in accordance with examples as disclosed herein.

FIG. 9 shows a flowchart illustrating a method 900 that supports lateral etch stops for access line formation in a memory die in accordance with examples as disclosed herein. The operations of method 900 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 905, the method may include forming (e.g., depositing, oxidizing) a stack of material layers over a substrate of a memory die, the stack of material layers including alternating layers of a first material and a second material. The operations of 905 may be performed in accordance with examples as disclosed herein.

At 910, the method may include forming a first trench through the stack of material layers. The operations of 910 may be performed in accordance with examples as disclosed herein.

At 915, the method may include forming (e.g., depositing, oxidizing) one or more third materials in the first trench. The operations of 915 may be performed in accordance with examples as disclosed herein.

At 920, the method may include forming a second trench through the stack of material layers between the first trench and a plurality of pillars associated with an array of memory cells. The operations of 920 may be performed in accordance with examples as disclosed herein.

At 925, the method may include forming a plurality of voids between the layers of the first material based at least in part on removing portions of the layers of the second material via the second trench. In some examples, forming the plurality of voids may expose respective sidewalls, between the layers of the first material, of the plurality of pillars. The operations of 925 may be performed in accordance with examples as disclosed herein.

At 930, the method may include forming a plurality of word lines electrically coupled with the plurality of pillars based at least in part on forming (e.g., depositing) one or more conductive materials in at least a subset of the plurality of voids. The operations of 930 may be performed in accordance with examples as disclosed herein.

In some examples, an apparatus (e.g., a manufacturing system) as described herein may perform a method or methods, such as the method 900. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method, apparatus, or non-transitory computer-readable medium including operations, features, circuitry, logic, means, or instructions, or any combination thereof for forming a stack of material layers over a substrate of a memory die, the stack of material layers including alternating layers of a first material and a second material; forming a first trench through the stack of material layers; forming one or more third materials in the first trench; forming a second trench through the stack of material layers between the first trench and a plurality of pillars associated with an array of memory cells; forming a plurality of voids between the layers of the first material based at least in part on removing portions of the layers of the second material via the second trench (e.g., where forming the plurality of voids may expose respective sidewalls, between the layers of the first material, of the plurality of pillars); and forming a plurality of word lines electrically coupled with the plurality of pillars based at least in part on forming (e.g., depositing) one or more conductive materials in at least a subset of the plurality of voids.

Aspect 2: The method, apparatus, or non-transitory computer-readable medium of aspect 1, where forming the plurality of voids exposes respective sidewalls, between the layers of the first material, of at least one of the one or more third materials.

Aspect 3: The method, apparatus, or non-transitory computer-readable medium of any of aspects 1 through 2, where forming the one or more third materials includes operations, features, circuitry, logic, means, or instructions, or any combination thereof for forming (e.g., depositing, oxidizing) a dielectric material in the first trench and forming (e.g., depositing) a conductive material in the first trench after forming the dielectric material.

Aspect 4: The method, apparatus, or non-transitory computer-readable medium of aspect 3, further including operations, features, circuitry, logic, means, or instructions, or any combination thereof for forming a plurality of cavities through the stack of material layers and forming a plurality of contacts coupled with circuitry under the stack of material layers based at least in part on forming the dielectric material in the plurality of cavities concurrently with forming the dielectric material in the first trench and forming the conductive material in the plurality of cavities concurrently with forming the conductive material in the first trench.

Aspect 5: The method, apparatus, or non-transitory computer-readable medium of aspect 4, further including operations, features, circuitry, logic, means, or instructions, or any combination thereof for forming a plurality of access lines over the stack of material layers and operable to electrically couple with the plurality of pillars, where the plurality of access lines are electrically coupled with at least a subset of the plurality of contacts.

Aspect 6: The method, apparatus, or non-transitory computer-readable medium of any of aspects 1 through 5, further including operations, features, circuitry, logic, means, or instructions, or any combination thereof for forming a third trench intersecting with the second trench, between a first subset of the plurality of pillars and a second subset of the plurality of pillars, where forming the plurality of voids is based at least in part on removing the portions of the layers of the second material via the third trench.

Aspect 7: The method, apparatus, or non-transitory computer-readable medium of any of aspects 1 through 6, further including operations, features, circuitry, logic, means, or instructions, or any combination thereof for forming a plurality of cavities through the stack of material layers and forming the plurality of pillars based at least in part on forming (e.g., depositing) a semiconductor material in the plurality of cavities.

Aspect 8: The method, apparatus, or non-transitory computer-readable medium of aspect 7, where forming the plurality of pillars includes operations, features, circuitry, logic, means, or instructions, or any combination thereof for forming (e.g., depositing, oxidizing) a first dielectric material in the plurality of cavities; forming (e.g., depositing) a charge trapping material in the plurality of cavities after forming the first dielectric material; forming (e.g., depositing, oxidizing) a second dielectric material in the plurality of cavities after forming the charge trapping material; and forming (e.g., depositing) the semiconductor material in the plurality of cavities after forming the second dielectric material.

Figure 10:
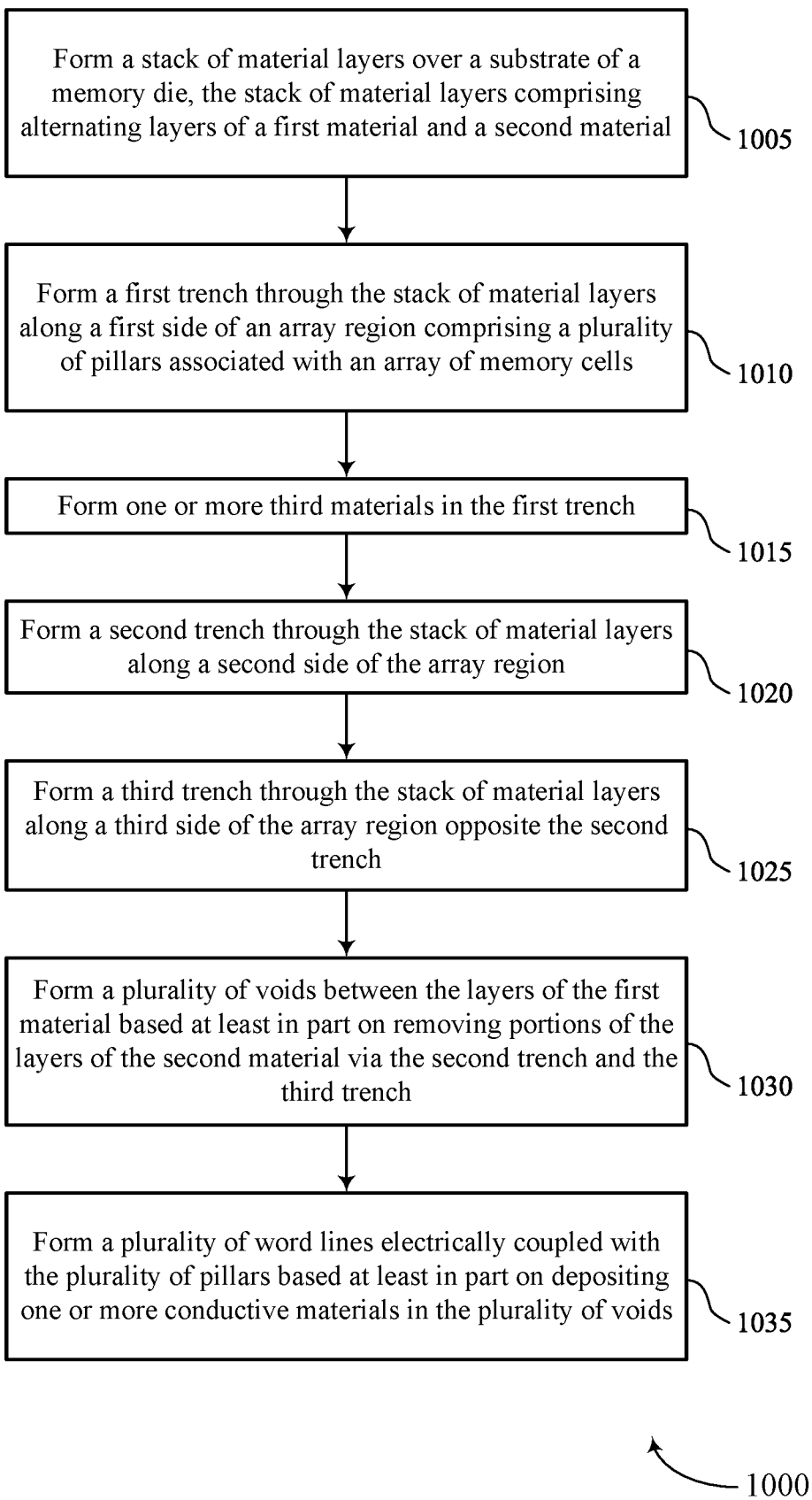

FIG. 10 shows a flowchart illustrating a method 1000 that supports lateral etch stops for access line formation in a memory die in accordance with examples as disclosed herein. The operations of method 1000 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 1005, the method may include forming (e.g., depositing) a stack of material layers over a substrate of a memory die, the stack of material layers including alternating layers of a first material and a second material. The operations of 1005 may be performed in accordance with examples as disclosed herein.

At 1010, the method may include forming a first trench through the stack of material layers along a first side of an array region including a plurality of pillars associated with an array of memory cells. The operations of 1010 may be performed in accordance with examples as disclosed herein.

At 1015, the method may include forming (e.g., depositing) one or more third materials in the first trench. The operations of 1015 may be performed in accordance with examples as disclosed herein.

At 1020, the method may include forming a second trench through the stack of material layers along a second side of the array region. The operations of 1020 may be performed in accordance with examples as disclosed herein.

At 1025, the method may include forming a third trench through the stack of material layers along a third side of the array region opposite the second trench. The operations of 1025 may be performed in accordance with examples as disclosed herein.

At 1030, the method may include forming a plurality of voids between the layers of the first material based at least in part on removing portions of the layers of the second material via the second trench and the third trench. In some examples, forming the plurality of voids exposes respective sidewalls, between the layers of the first material, of the plurality of pillars. The operations of 1030 may be performed in accordance with examples as disclosed herein.

At 1035, the method may include forming a plurality of word lines electrically coupled with the plurality of pillars based at least in part on forming (e.g., depositing) one or more conductive materials in the plurality of voids. The operations of 1035 may be performed in accordance with examples as disclosed herein.

In some examples, an apparatus (e.g., a manufacturing system) as described herein may perform a method or methods, such as the method 1000. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 9: A method, apparatus, or non-transitory computer-readable medium including operations, features, circuitry, logic, means, or instructions, or any combination thereof for forming a stack of material layers over a substrate of a memory die, the stack of material layers including alternating layers of a first material and a second material; forming a first trench through the stack of material layers along a first side of an array region including a plurality of pillars associated with an array of memory cells; forming one or more third materials in the first trench; forming a second trench through the stack of material layers along a second side of the array region; forming a third trench through the stack of material layers along a third side of the array region opposite the second trench; forming a plurality of voids between the layers of the first material based at least in part on removing portions of the layers of the second material via the second trench and the third trench (e.g., where forming the plurality of voids may expose respective sidewalls, between the layers of the first material, of the plurality of pillars); and forming a plurality of word lines electrically coupled with the plurality of pillars based at least in part on forming (e.g., depositing) one or more conductive materials in the plurality of voids.

Aspect 10: The method, apparatus, or non-transitory computer-readable medium of aspect 9, where the second trench is non-coincident with the first trench and the third trench is non-coincident with the first trench.

Aspect 11: The method, apparatus, or non-transitory computer-readable medium of any of aspects 9 through 10, where forming the plurality of voids exposes respective sidewalls, between the layers of the first material, of at least one of the one or more third materials.

Aspect 12: The method, apparatus, or non-transitory computer-readable medium of any of aspects 9 through 11, where forming the one or more third materials includes operations, features, circuitry, logic, means, or instructions, or any combination thereof for forming (e.g., depositing, oxidizing) a dielectric material in the first trench and forming (e.g., depositing) a conductive material in the first trench after forming the dielectric material.

Aspect 13: The method, apparatus, or non-transitory computer-readable medium of aspect 12, further including operations, features, circuitry, logic, means, or instructions, or any combination thereof for forming a plurality of cavities through the stack of material layers and forming a plurality of contacts coupled with circuitry under the stack of material layers based at least in part on forming the dielectric material in the plurality of cavities concurrently with forming the dielectric material in the first trench and forming the conductive material in the plurality of cavities concurrently with forming the conductive material in the first trench.

Aspect 14: The method, apparatus, or non-transitory computer-readable medium of any of aspects 9 through 13, further including operations, features, circuitry, logic, means, or instructions, or any combination thereof for forming a plurality of cavities through the stack of material layers in the array region and forming the plurality of pillars based at least in part on forming (e.g., depositing) a semiconductor material in the plurality of cavities.

Aspect 15: The method, apparatus, or non-transitory computer-readable medium of aspect 14, where forming the plurality of pillars includes operations, features, circuitry, logic, means, or instructions, or any combination thereof for forming (e.g., depositing, oxidizing) a first dielectric material in the plurality of cavities; forming (e.g., depositing) a charge trapping material in the plurality of cavities after forming the first dielectric material; forming (e.g., depositing) a second dielectric material in the plurality of cavities after forming the charge trapping material; and forming (e.g., depositing) the semiconductor material in the plurality of cavities after forming the second dielectric material.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 16: An apparatus, including: an array region of a memory die including a plurality of pillars associated with a plurality of memory cells, the plurality of pillars extending through a stack of material layers of the array region including alternating layers of a first dielectric material and one or more conductive materials; a first isolation region extending through the stack of material layers and aligned along a first side of the array region, the first isolation region including a second dielectric material in contact with the layers of the one or more conductive materials; a second isolation region extending through the stack of material layers and aligned along a second side of the array region opposite the first side, the second isolation region including the second dielectric material in contact with the layers of the one or more conductive materials; and a third isolation region between the first isolation region and the second isolation region and extending through the stack of material layers, the third isolation region including a third dielectric material in contact with the layers of the one or more conductive materials, the third dielectric material physically separated from the second dielectric material of the first isolation region and the second dielectric material of the second isolation region.

Aspect 17: The apparatus of aspect 16, where at least one of the one or more conductive materials extends between the first isolation region and the third isolation region, or between the second isolation region and the third isolation region, or both.

Aspect 18: The apparatus of any of aspects 16 through 17, further including: a fourth isolation region intersecting with the third isolation region and around an end of the first isolation region, the fourth isolation region including the third dielectric material.

Aspect 19: The apparatus of any of aspects 16 through 18, where the third isolation region includes one or more second conductive materials in contact with the third dielectric material and electrically isolated from the layers of the one or more conductive materials.

Aspect 20: The apparatus of aspect 19, further including: one or more electrical contacts through the stack of material layers and coupled with circuitry under the stack of material layers, the one or more electrical contacts including respective portions of the third dielectric material and of the one or more second conductive materials.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    forming a stack of material layers over a substrate of a memory die, the stack of material layers comprising alternating layers of a first material and a second material;
    forming a first trench through the stack of material layers;
    forming one or more third materials in the first trench, wherein forming the one or more third materials comprises:
        forming a dielectric material in the first trench; and
        forming a conductive material in the first trench after forming the dielectric material;
    forming a second trench through the stack of material layers between the first trench and a plurality of pillars associated with an array of memory cells;
    forming a plurality of voids between the layers of the first material based at least in part on removing portions of the layers of the second material via the second trench, wherein forming the plurality of voids exposes respective sidewalls, between the layers of the first material, of the plurality of pillars; and
    forming a plurality of word lines electrically coupled with the plurality of pillars based at least in part on forming one or more conductive materials in at least a subset of the plurality of voids.

2. The method of claim 1, wherein forming the plurality of voids exposes respective sidewalls, between the layers of the first material, of at least one of the one or more third materials.

3. The method of claim 1, further comprising:
    forming a plurality of cavities through the stack of material layers; and
    forming a plurality of contacts coupled with circuitry under the stack of material layers based at least in part on forming the dielectric material in the plurality of cavities concurrently with forming the dielectric material in the first trench and forming the conductive material in the plurality of cavities concurrently with forming the conductive material in the first trench.

4. The method of claim 3, further comprising:
    forming a plurality of access lines over the stack of material layers and operable to electrically couple with the plurality of pillars, wherein the plurality of access lines are electrically coupled with at least a subset of the plurality of contacts.

5. The method of claim 1, further comprising:
    forming a third trench intersecting with the second trench, between a first subset of the plurality of pillars and a second subset of the plurality of pillars, wherein forming the plurality of voids is based at least in part on removing the portions of the layers of the second material via the third trench.

6. The method of claim 1, further comprising:
    forming a plurality of cavities through the stack of material layers; and
    forming the plurality of pillars based at least in part on forming a semiconductor material in the plurality of cavities.

7. The method of claim 6, wherein forming the plurality of pillars comprises:
    forming a first dielectric material in the plurality of cavities;
    forming a charge trapping material in the plurality of cavities after forming the first dielectric material;
    forming a second dielectric material in the plurality of cavities after forming the charge trapping material; and
    forming the semiconductor material in the plurality of cavities after forming the second dielectric material.

8. A method, comprising:
    forming a stack of material layers over a substrate of a memory die, the stack of material layers comprising alternating layers of a first material and a second material;
    forming a first trench through the stack of material layers along a first side of an array region comprising a plurality of pillars associated with an array of memory cells;
    forming one or more third materials in the first trench, wherein forming the one or more third materials comprises:
        forming a dielectric material in the first trench; and
        forming a conductive material in the first trench after forming the dielectric material;
    forming a second trench through the stack of material layers along a second side of the array region;
    forming a third trench through the stack of material layers along a third side of the array region opposite the second trench;
    forming a plurality of voids between the layers of the first material based at least in part on removing portions of the layers of the second material via the second trench and the third trench, wherein forming the plurality of voids exposes respective sidewalls, between the layers of the first material, of the plurality of pillars; and
    forming a plurality of word lines electrically coupled with the plurality of pillars based at least in part on forming one or more conductive materials in the plurality of voids.

9. The method of claim 8, wherein:
    the second trench is non-coincident with the first trench; and
    the third trench is non-coincident with the first trench.

10. The method of claim 8, wherein forming the plurality of voids exposes respective sidewalls, between the layers of the first material, of at least one of the one or more third materials.

11. The method of claim 8, further comprising:
    forming a plurality of cavities through the stack of material layers; and
    forming a plurality of contacts coupled with circuitry under the stack of material layers based at least in part on forming the dielectric material in the plurality of cavities concurrently with forming the dielectric material in the first trench and forming the conductive material in the plurality of cavities concurrently with forming the conductive material in the first trench.

12. The method of claim 8, further comprising:
    forming a plurality of cavities through the stack of material layers in the array region; and
    forming the plurality of pillars based at least in part on forming a semiconductor material in the plurality of cavities.

13. The method of claim 12, wherein forming the plurality of pillars comprises:
- forming a first dielectric material in the plurality of cavities;
- forming a charge trapping material in the plurality of cavities after forming the first dielectric material;
- forming a second dielectric material in the plurality of cavities after forming the charge trapping material; and
- forming the semiconductor material in the plurality of cavities after forming the second dielectric material.

14. A memory device, formed by a process comprising:
- forming a stack of material layers over a substrate of a memory die, the stack of material layers comprising alternating layers of a first material and a second material;
- forming a first trench through the stack of material layers;
- forming one or more third materials in the first trench, wherein forming the one or more third materials comprises:
  - forming a dielectric material in the first trench; and
  - forming a conductive material in the first trench after forming the dielectric material;
- forming a second trench through the stack of material layers between the first trench and a plurality of pillars associated with an array of memory cells;
- forming a plurality of voids between the layers of the first material based at least in part on removing portions of the layers of the second material via the second trench, wherein forming the plurality of voids exposes respective sidewalls, between the layers of the first material, of the plurality of pillars; and
- forming a plurality of word lines electrically coupled with the plurality of pillars based at least in part on forming one or more conductive materials in at least a subset of the plurality of voids.

15. The memory device of claim 14, wherein forming the plurality of voids exposes respective sidewalls, between the layers of the first material, of at least one of the one or more third materials.

16. The memory device of claim 14, formed by the process further comprising:
- forming a third trench intersecting with the second trench, between a first subset of the plurality of pillars and a second subset of the plurality of pillars, wherein forming the plurality of voids is based at least in part on removing the portions of the layers of the second material via the third trench.

17. The memory device of claim 14, formed by the process further comprising:
- forming a plurality of cavities through the stack of material layers; and
- forming the plurality of pillars based at least in part on forming a semiconductor material in the plurality of cavities.

* * * * *